United States Patent
Bowen et al.

(10) Patent No.: US 6,279,142 B1
(45) Date of Patent: Aug. 21, 2001

(54) METHOD OF ON-CHIP INTERCONNECT DESIGN

(75) Inventors: Michael Alexander Bowen, Poughkeepsie, NY (US); Moises Cases, Austin, TX (US); Howard Harold Smith, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/165,956

(22) Filed: Oct. 2, 1998

(51) Int. Cl.[7] .................................................. G06F 17/50
(52) U.S. Cl. ......................................... 716/5; 703/13
(58) Field of Search ................................ 703/14, 13, 19; 716/4, 5, 6, 12, 2

(56) References Cited

U.S. PATENT DOCUMENTS

| | | | |
|---|---|---|---|
| 4,615,011 | | 9/1986 | Linsker ................................ 364/491 |
| 5,341,310 | | 8/1994 | Gould et al. ......................... 364/491 |
| 5,359,535 | | 10/1994 | Djaja et al. .......................... 364/489 |
| 5,381,345 | | 1/1995 | Takegami et al. .................... 364/491 |
| 5,446,674 | * | 8/1995 | Ikeda et al. .............................. 716/5 |
| 5,479,357 | | 12/1995 | Yoshimura ........................... 364/489 |
| 5,502,649 | | 3/1996 | Hirata .................................. 364/490 |
| 5,568,395 | * | 10/1996 | Huang ...................................... 716/4 |
| 5,596,506 | * | 1/1997 | Petschauer et al. ..................... 716/5 |
| 5,610,833 | * | 3/1997 | Chang et al. ......................... 364/491 |
| 5,682,336 | * | 10/1997 | Chian et al. ............................. 703/3 |
| 5,828,580 | * | 10/1998 | Ho ........................................ 716/12 |
| 5,923,568 | * | 7/1999 | Oh et al. .............................. 364/490 |
| 5,999,726 | * | 12/1999 | Ho ........................................ 716/11 |
| 6,018,623 | * | 1/2000 | Chang et al. ............................ 716/6 |
| 6,057,171 | * | 5/2000 | Chou et al. ............................ 438/15 |
| 6,061,508 | * | 5/2000 | Mehrotra et al. ....................... 716/6 |

OTHER PUBLICATIONS

Moises Cases et al., "Deep Submicron Design Issues for a 6.9 Million Transistor Microprocessor", Proceedings DesignCon '98 On-Chip System Design Conference, Jan. 26–29, 1998, Santa Clara, CA pp. 333–355.

B. J. Rubin et al., "Calculation of Multi-Port Parameters of Electronic Packages Using a General Purpose Electromagnetics Code", Proceedings of the IEEE 2nd Topical Meeting on Electrical Performance of Electronic Packaging, EPEP '93, Oct. 20–23, Monterey, CA, pp. 37–39, (1993).

Curtis L. Ratzlaff et al., "RICE: Rapid Interconnect Circuit Evaluation Using AWE", *IEEE Transactions on Computer-Aided Design of Integrated Circuits and Systems*, vol. 13, No. 6, Jun. 1994, pp. 763–776.

Howard Smith et al., Proceedings of the IEEE 5th Topical Meeting on Electrical Performance of Electronic Packaging, pp. 33–35 (Oct. 1996).

\* cited by examiner

*Primary Examiner*—Matthew Smith
*Assistant Examiner*—Leigh Marie Garbowski
(74) *Attorney, Agent, or Firm*—Barry S. Newberger; Winstead Sechrest & Minick P.C.; Bob Carwell

(57) ABSTRACT

A method of on-chip interconnect design in an integrated circuit (IC) is provided. Fast circuit simulations of each net constituting the IC are performed for noise margin and slew rate analysis. A resistor/capacitor (RC) network for each net is generated from net lengths, and assignments of parasitic cross-coupling capacitances and shunt capacitances derived from three-dimensional field solver evaluations of pre-routing phase estimated wire geometries. If the noise margin and slew rate criteria are not satisfied for the net under simulation, the simulations are iterated, with a new wire geometry selected between iterations, until the criteria are satisfied. Each net is tagged with a wire geometry that satisfies noise margin and slew rate requirements which can then be passed to a routing tool.

30 Claims, 4 Drawing Sheets

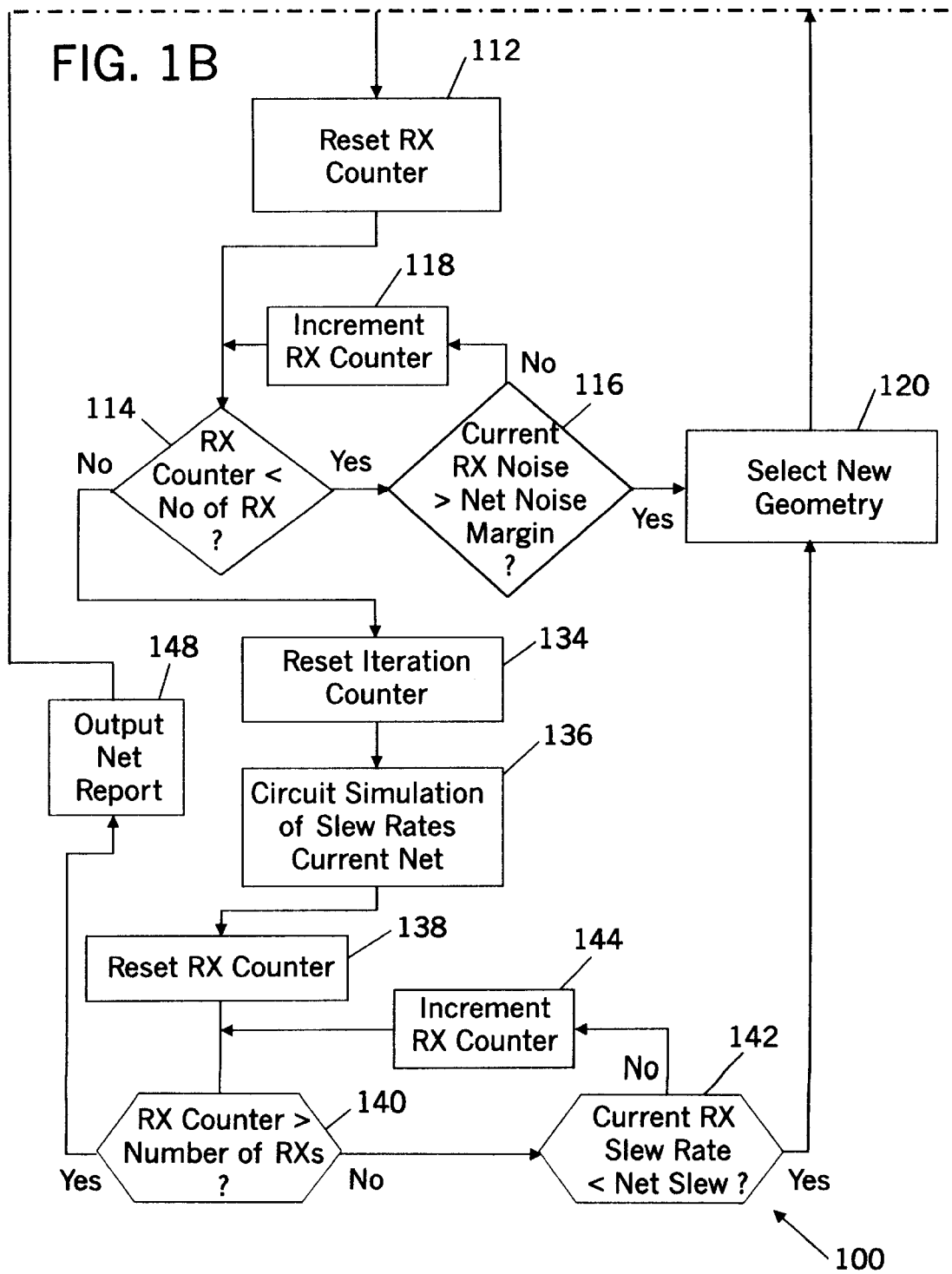

METHOD OF ON-CHIP INTERCONNECT DESIGN

TECHNICAL FIELD

The present invention relates in general to integrated circuit fabrication methods, and in particular, to early-stage design of on-chip interconnects to reduce on-chip signal coupled noise and signal transition rate degradation.

BACKGROUND INFORMATION

Continued advances in silicon complementary metal oxide semiconductor (CMOS) technologies have yielded significant increases in both circuit speed and wiring density. These improvements have resulted from reductions in device physical parameters, wire physical dimensions and power supply voltages. As a result of scaling to sub-micron dimensions, a significant proportion of propagation delays are transferred from the logic gates to the on-chip interconnecting wires due to the increase in serial RC effects. This causes a degradation of the transition, or slew rate, of the driving signal, resulting in additional net delay.

Furthermore, the scaling has led to wire geometries with aspect ratios (thickness/width) greater than one. The increased aspect ratios along with the reduction in conductor spacings resulting from the scaling to smaller dimensions gives rise to increased coupling capacitance to neighboring wires. This increases signal coupled noise to nearby nets. In addition, lower power supply voltages reduce the noise margin of logical circuits, making chip functionality more sensitive to interconnect parasitic effects.

As a consequence, data integrity issues are exacerbated as integrated circuit sizes are reduced. These issues include false switch or latch disturb problems due to excessive line to line noise coupling. The influence of adjacent lines switching, in conjunction with poor transition rates in the target net, can create a significant delay variation or noise jitter which can be detrimental to chip functionality, performance and reliability. In fabrication methodologies according to the prior art, these are typically resolved in post-route noise and jitter checks. For nets that failed to conform to noise and slew rate specification, iterating post-route designs to bring the offending networks into conformance with the specifications is costly.

Although methods of pre-route design have been used in the art, these have been limited in their effectiveness. A wire rule based approach has been used to address noise and slew rate criteria in the pre-route phase of IC design. See, Howard Smith and Noises Cases, "Wire Rule Methodology for On-Chip Interconnects," IEEE EPEP 96, pp. 33–35, October 1996. This methodology admits only a single net length. Thus, noise margin and slew rate designs using this methodology relies on a simple "averaged" receiver position to represent each receiver in the net.

Therefore, there is a need in the art for a design methodology that reduces the need for post-route design iterations. Such a methodology would address on-chip signal coupled noise and slew rate degradation in the early stages of the chip design cycle.

SUMMARY OF THE INVENTION

The aforementioned needs are addressed by the present invention. Accordingly, there is provided, in a first form, a method of integrated circuit (IC) design. The method includes the steps of generating a resistor/capacitor (RC) network for a current net, and assigning a parasitic coupling capacitance and a shunt capacitance to a reference electrode for each network capacitor in the RC network. The capacitances are derived from a three dimensional (3-D) field solution for a preselected wire geometry. These wire geometries are specified as a conductor width and associated minimum spacing to an assumed neighboring net. A first circuit simulation of the current net including the RC network from the assigning step, wherein the first circuit simulation outputs net noise signals generated in response to a noise source.

Additionally, there is provided, in a second form a computer program product on a computer readable medium for IC design. The computer program product includes programming for generating a resistor/capacitor (RC) network for a current net and programming for assigning a parasitic coupling capacitance and a shunt capacitance to a reference electrode for each network capacitor in the RC network.

The capacitances are derived from a three dimensional (3-D) field solution for a preselected wire geometry. Also includes is programming for performing a first circuit simulation of the current net including the RC network from the assigning step, wherein the first fast circuit simulation outputs net noise signals generated in response to a noise source.

There is also provided, in a third form, a data processing system for integrated circuit (IC) design having circuitry operable for generating a resistor/capacitor (RC) network for a current net, and circuitry operable for assigning a parasitic coupling capacitance and a shunt capacitance to a reference electrode for each network capacitor in the RC network, wherein the capacitances are derived from a three dimensional (3-D) field solution for a preselected wire geometry. The data processing system further includes circuitry operable for performing a first circuit simulation of the current net including the RC network from the assigning step, wherein the first fast circuit simulation outputs net noise signals generated in response to a noise source.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 4 illustrates, in block diagram form, a data processing system in accordance with one embodiment of the present invention.

DETAILED DESCRIPTION

Figure 1A:
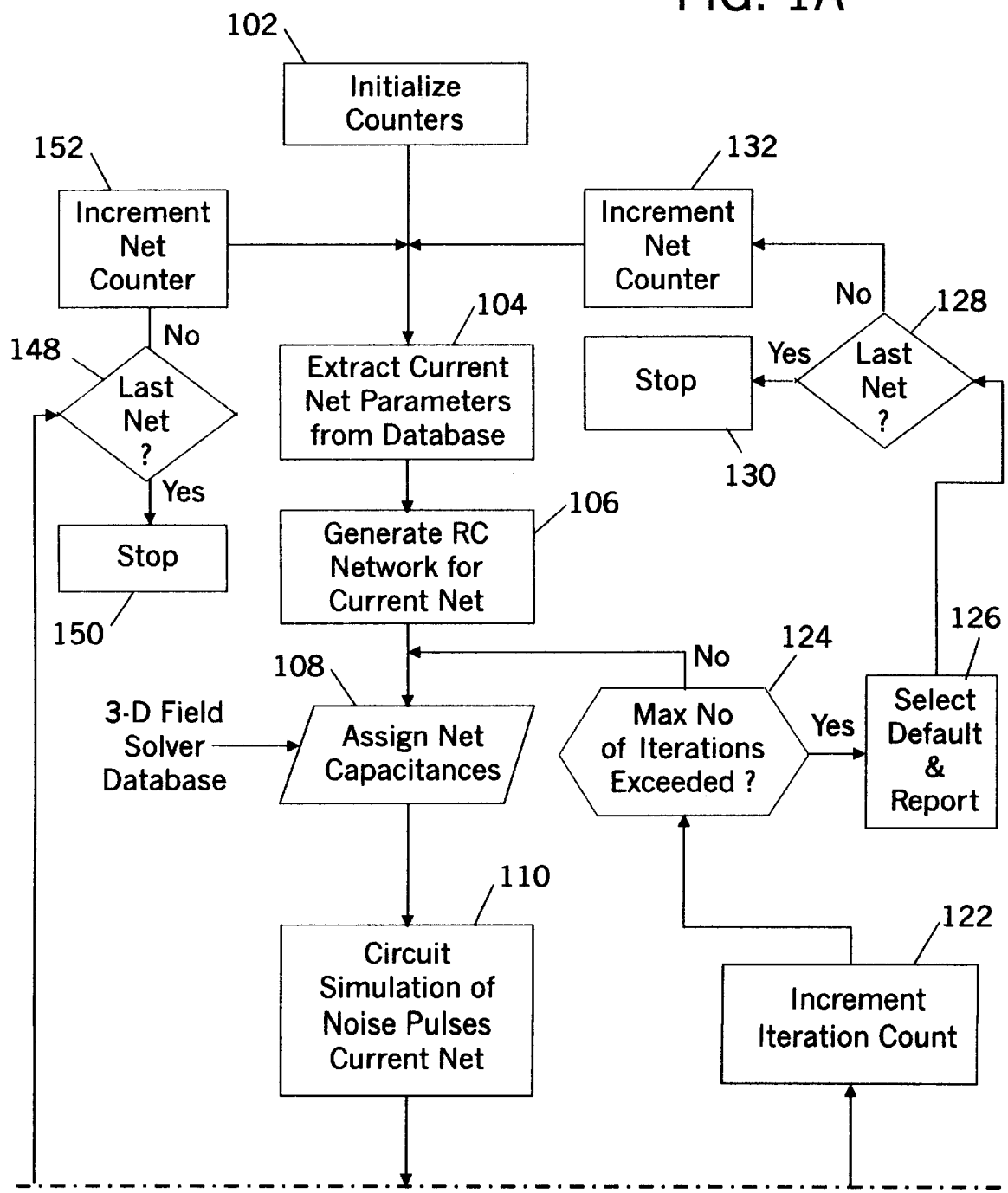
FIG. 1 illustrates, in flowchart form, a method of integrated circuit design in accordance with an embodiment of the present invention.

The present invention provides a method of integrated circuit (IC) chip design for reducing cross-talk noise and transition rate degradation in the pre-route design phase. A fast circuit simulation is used to predict the potential crosstalk noise and transition rate for each net topology. Driver size, transition rate limits and receiver noise margin parameters, and the resistor/capacitor (RC) network are extracted from the chip design databases. Capacitance ratios derived from three dimensional field solver results are used to assign network capacitances between capacitance to ground and parasitic capacitance to a potential noise source. The resulting net parameters are used in fast circuit simulations of noise margins and transition rates. If the noise margin or transition rate requirements are not met, the method iterates on the wire geometry to determine a geometry which meets both criteria.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

Refer now to the drawings wherein depicted elements are not necessarily shown to scale and wherein like or similar elements are designated by the same reference numeral through the several views.

Figure 2:
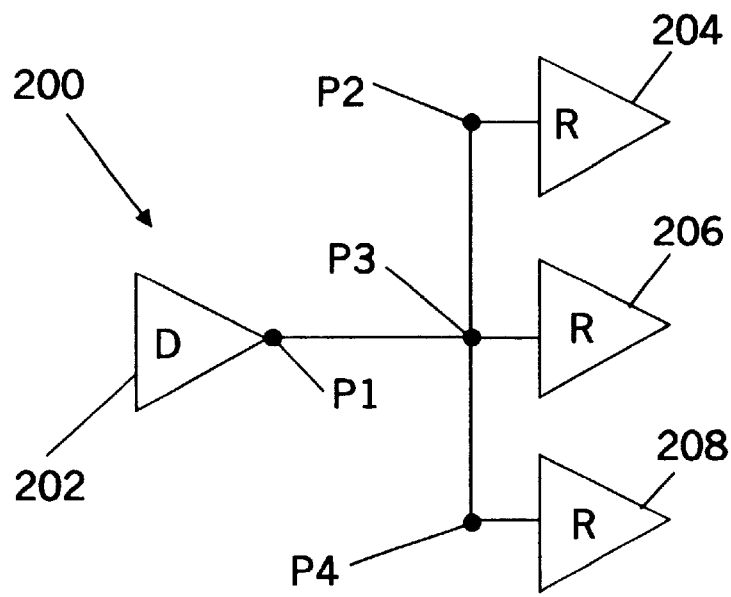
FIG. 2 illustrates, in block diagram form, an exemplary net in accordance with an embodiment of the present invention.

Referring to FIG. 1, a flowchart of method 100 for IC design according to an embodiment of the present invention is illustrated. Method 100 analyzes an integrated circuit to be fabricated on a net-by-net basis. Each net within the integrated circuit includes a driving logic circuit (driver) and the receiving logic circuits coupled to the driver output (receivers) which receive the logical signals output by the driver. In step 102, counters for indexing the nets constituting the integrated circuit device under design, and for counting the number of iterations over wire geometries are initialized. This counter is directly associated with a preselected list of wire geometries (width/spacing). Geometries are selected based on routing constraints and expected performance requirements, that is, noise and slew rate constraints. In step 104, parameters for the current net are extracted from a net list database. A net list describes the logical interconnection of the IC as determined by the logic design of the chip. It includes, for each net, the size of the driver, and the noise margin and slew rate limits of each receiver in the net. As an example, FIG. 2 illustrates a generic net 200 including driver ("D") 202 and three receivers ("RX") 204, 206 and 208. Physical pin locations, P1, P2, P3, and P4 locate the output node of driver 202 and the input nodes of receivers 204, 206 and 208, respectively. Net 200 is illustrative only, and it would be understood that a typical net in an IC would incorporate a greater number of receivers coupled to a driver.

In step 106, an RC network for the current net is generated. For a preselected initial pin placement, such as pin locations P1–P4 in FIG. 2, a wire network topology is estimated. This may be based on a Steiner tree algorithm. A Steiner tree algorithm, seeks to find the minimal network connecting a given set of points. A minimal network is the shortest network spanning the given set of points. From the net topology, the RC network for the current net is determined using parameterized (i.e., per unit length) resistance and capacitance values based on a preselected conductor width/spacing.

However, the net topology from step 106 does not include information with respect to conductor adjacencies. The net capacitances determined in step 106 assume neighboring conductors are grounded, yielding a total parameterized capacitance. In step 108, capacitance ratios derived from a three dimensional (3-D) field solver are associated with the wire geometry. The field solver generates a solution of the electromagnetic field for structures composed of arrangements of conductors and dielectrics. The capacitance ratios are determined from the solution for the electromagnetic field for the wire geometry using known physical principals. A 3-D field solver which may be used in an embodiment of the present invention has been described. Barry J. Rubin and Shahrokh Daijavad, "Calculations of Multi-Port Parameters of Electronic Packages Using a General Purpose Electromagnetic Code," *Proceedings of the IEEE 2nd Topical Meeting on Electrical Performance of Electronic Packaging*, EPEP '93, Oct. 20–23, 1993, which is hereby expressly incorporated herein by reference. The network capacitances from step 106 are thereby apportioned between capacitance to ground and parasitic cross-coupling capacitance to a potential noise source using the capacitance ratios provided from the 3-D field solutions.

Figure 3A:
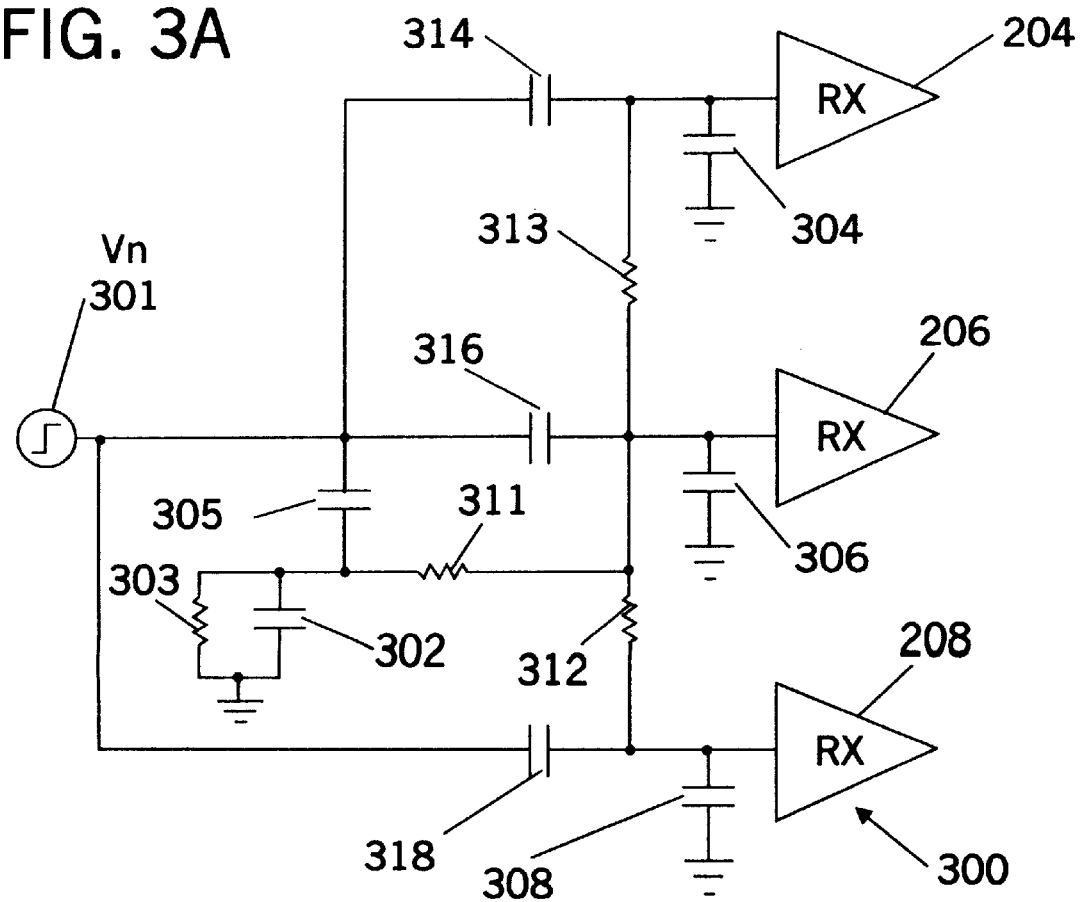
FIG. 3A illustrates in partial schematic form, a noise margin simulation circuit in accordance with an embodiment of the present invention.

In step 110, a circuit simulation of noise pulses in the current net based on the RC network from step 108 is performed. An embodiment of the present invention may perform fast circuit simulations using a fast circuit simulator, such as the Rapid Interconnect Circuit Evaluator ("RICE"), a circuit simulation method known in the art. See, e.g., Curtis L. Ratzlaff and Lawrence T. Pillage, "RICE: Rapid Interconnect Circuit Evaluation Using AWE," *IEEE Transactions on Computer-Aided Design of Integrated Circuits and Systems*, Vol. 13, pp. 763–776 (June 1994), which is hereby expressly incorporated herein by reference. FIG. 3A illustrates, in partial schematic form, a simulation circuit, operable for noise simulations, corresponding to net 200 in FIG. 2. For noise simulations, a simulated noise source 302 is included in net 200. In simulation circuit 300, driver 202 in FIG. 2 is replaced by its output impedance, resistor 303. Driver 202 also experiences a shunt capacitance to ground, capacitance 302, due to the wiring topology and a cross-coupling capacitance 305 to noise source 301. Each of receivers (or sinks) 204, 206, and 208 experiences a shunt capacitance, 304, 306 and 308, respectively, arising from the wiring geometry. Wiring resistance is represented by resistors 311, 312 and 313. Resistor 311 is associated with the wiring path from the output of driver 202 in FIG. 2 to the common pin, P3, and resistors 312 and 313 are associated with the network paths between pin P4 and pin P3, and between pin P2 and pin P3, respectively. Each of receivers 204, 206 and 208 also have parasitic capacitances arising from the wiring geometry, as discussed in conjunction with step 108. These are capacitance 314 coupling receiver 204 to noise source 301, capacitor 316 coupling receiver 206 to noise source 301 and capacitor 318 coupling receiver 208 to noise source 308. It is understood that simulation circuit 300, in FIG. 3A is illustrative only, and that the present invention is not limited to network topologies in circuit 300. Moreover, a typical net in an IC includes more receivers and consequently the simulations circuit corresponding thereto would include additional RC elements.

The noise signal at each receiver in the net under simulation must be compared with the noise margin specified in the IC design and extracted from the design database in step 104. In step 112, a receiver counter is reset. Method 100 then loops through each of the receivers in the current net. If in step 114, the current receiver counter is less than the number of receivers in the current net, the noise signal at the current receiver is compared to the specified noise margin in step 116.

In an embodiment of the present invention, the set of wire geometries selected, initially in step 108, and subsequently in step 120 to be discussed, may be based on worst case coupling scenarios in order to reduce post-route rework of the net. Alternatively, an embodiment may employ a less than worst case design criterion. Such an embodiment may exploit information learned in the design of other ICs. For example, the IC under design may be a member of an architectural family of ICs which share a common or similar architecture. When statistical data based on post-route analysis of other IC designs are available, the design criterion may admit of a statistical relaxation of the worst case limit. Based on statistics obtained from the previous design analysis, statistical criteria may be applied to assign the network capacitances. For example, interconnects having lengths smaller than a first preselected value may have a coupling over a first preselected percentage of their length. Interconnects having lengths in a second range of lengths contiguous with the first length range may have a coupling over a second preselected percentage of their length, and so forth. The parasitic cross coupling capacitances allocated in step 108 would then be adjusted by the corresponding percentage, each of which is less than one-hundred percent (100%).

If the noise margin requirement is satisfied for the current receiver, the sink counter is incremented in step 118, and method 100 loops until all receivers in the current net has been tested.

If, however, in step 116, the noise signal at the current receiver exceeds the specified noise margin, a new wiring geometry is selected from the preselected set in step 120. Method 100 continues by performing a new simulation with a new wiring geometry. In step 122, an iteration counter is incremented, and in step 124, the counter is compared against a preselected maximum number of iterations. If the maximum number of iterations has not been exceeded, method 100 generates a new circuit noise simulation by returning to step 108 wherein the network capacitances are apportioned between the parasitic cross-coupling capacitances and ground capacitances as previously described in conjunction with step 108.

Method 100 continues to loop through steps 108, 110, 112, 114, 116, 120, 122, and 124 until a geometry meeting the noise requirements of the current sink are found, or until a preselected maximum number of iterations is exceeded in step 124. If the maximum number of iterations is exceeded, in step 124, method 100 continues by selecting a predetermined default geometry for the current net and reports the results of the noise simulation in step 126. If the current net is the last net, in step 128, method 100 stops, in step 130. Otherwise, the net counter is incremented in step 132 and method 100 continues with the next net in the net list.

Figure 3B:
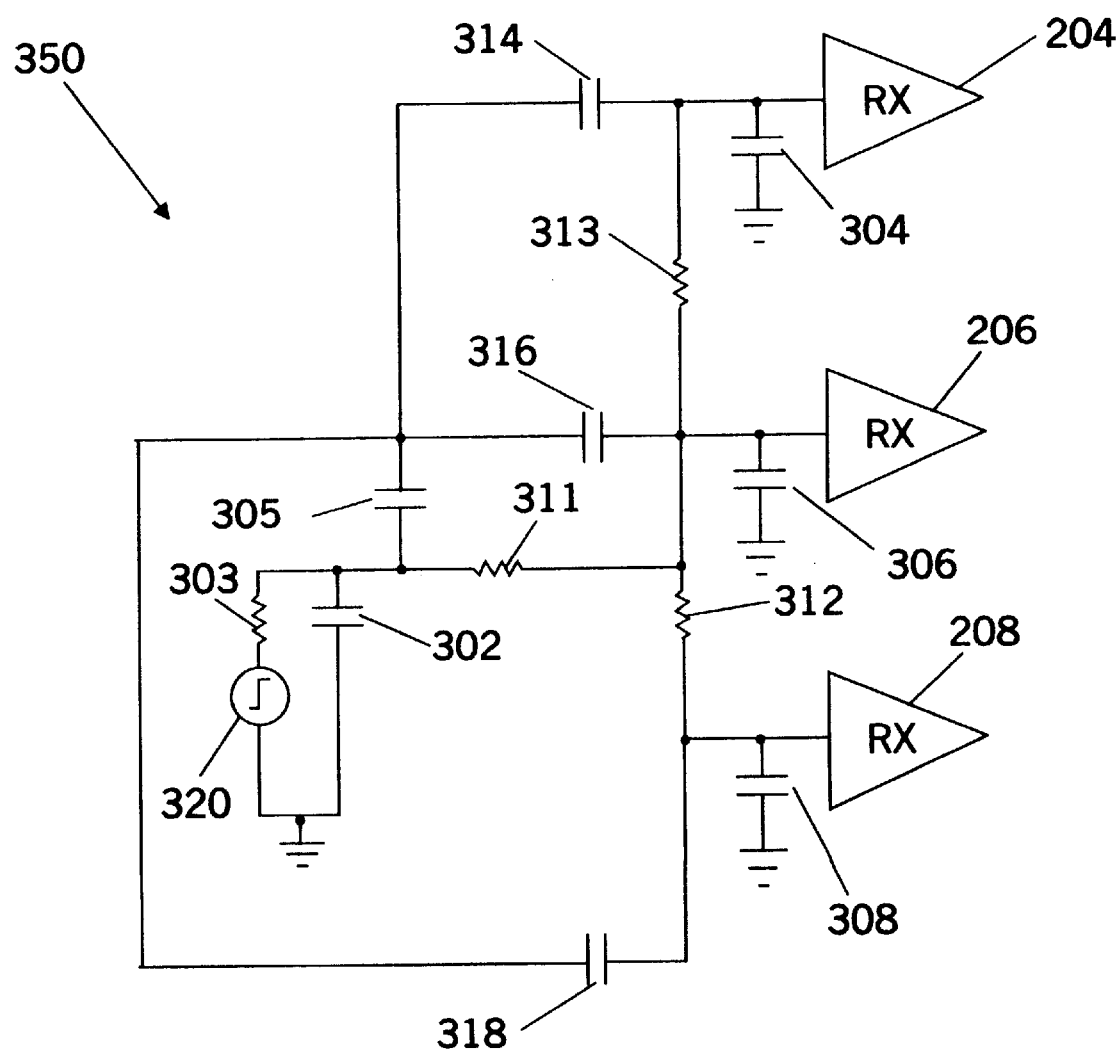
FIG. 3B illustrates, in partial schematic form, a slew rate simulation circuit in accordance with an embodiment of the present invention.

If, in step 124, the maximum number of iterations has not been exceeded, and, in step 114 all receivers have been evaluated for noise margin, then method 100 continues with fast circuit simulation of slew rates, in step 114. The receiver counter then exceeds the number of receivers in the current net and step 114 takes its "No" path and the iteration counter is reset in step 134. In step 136, circuit simulation of the slew rates of the current net is performed. The slew rate simulation circuit includes the RC network generated in step 106 with the capacitance assignments derived in step 108. The initial wire geometry selection used for the slew calculation is the geometry reported in step 126. Circuit 350 operable for slew rate simulations for net 200 in FIG. 2 is illustrated in FIG. 3B. The RC network in circuit 350 is the same as the RC network in noise simulation circuit 300 of FIG. 3A. In slew rate simulation circuit 350, driver 202 of net 200 includes signal voltage source 320 in series with its output impedance, resistor 303. The fast circuit simulation in step 136 determines the slew rate of the signals appearing at each of the receivers of the current net in response to signal voltage 320. It is understood that simulation circuit 350 is illustrative only and that the present invention is not limited to network topologies in circuit 350. Moreover, a typical net in an IC includes more receivers and consequently the simulation circuit corresponding thereto would include additional RC elements.

Method 100 continues by looping through each of the receivers in the net to determine if the slew rate of the signal at each receiver is within the slew rate specification input from the net list in step 104. In step 138, a receiver counter is reset, and in steps 140, 142, and 144, method 100 loops through the receivers in the net to determine if, for each receiver, the current net slew rate criterion is met.

If, in step 140, if the current receiver is not the last receiver in the net, in step 142, its slew rate is compared to the slew rate criteria for the current net. If the current receiver's slew rate is less than the slew rate specified, a new geometry is selected in step 120, the iteration counter is incremented in step 122 and, if in step 124, the maximum number of iterations has not been exceeded, method 100 continues in step 108 to a simulation of the new geometry selected in step 120.

In an alternative embodiment, the preselected wire geometry list may be ordered such that if a new geometry is selected based on slew rate considerations it will automatically satisfy noise constraints provided the preceding geometry did so. In such an embodiment, method 100 may branch after step 108 directly to step 136 and continue with the slew rate simulation of the new geometry.

However, if, in step 124, a preselected maximum number of iterations is exceeded, a default geometry is selected in step 126, and method 100 continues to the next net in the net list, in step 128. If, in step 128, the current net is the last net in the net list, method 100 terminates in step 130. Otherwise, method 100 continues to the next net in the net list by incrementing the net counter in step 132 and continues to simulations of the next net in the net list by returning to step 104.

If, in step 140, all receivers in the net have satisfied the net noise margin, then, in step 146, a net report is outputted and method 100 proceeds to the next net, where in step 148, if the current net is the last net, method 100 terminates in step 150. Otherwise, in step 148, method 100 continues to a simulation of the next net by incrementing the net counter in step 152, and returning to step 104.

Thus, method 100 at completion, tags each net with a wire geometry that satisfies slew rate and coupled noise limits. These may be used by a routing tool to avoid coupled noise and slew rate degradation, thereby reducing the number of nets requiring post-route checking and reducing the number of nets requiring manual correction. Although method 100 has been discussed in the context of the pre-route design phase, it would be understood that it may be employed in the post-route phase wherein actual wire geometries are available. Although the embodiment of method 100 described hereinabove performs the noise margin design before the slew rate simulations, it would be understood that, alternatively, an embodiment of the present invention may first perform the slew rate design and then the noise margin design. In other words, an alternative embodiment may first perform steps 136, 138, 140, 142 and 144 and after refining the net based on the slew rate criterion, design for noise margin by performing steps 108, 110, 112, 114, 116 and 118.

Referring first to FIG. 4, an example is shown of a data processing system 400 which may be used for the invention. The history buffer (not shown) of the present invention is included in CPU 410. The CPU 410 is coupled to various other components by system bus 412. Read only memory ("ROM") 416 is coupled to the system bus 412 and includes a basic input/output system ("BIOS") that controls certain basic functions of the data processing system 400. Random access memory ("RAM") 414, I/O adapter 418, and communications adapter 434 are also coupled to the system bus 412. I/O adapter 418 may be a small computer system interface ("SCSI") adapter that communicates with a disk storage device 420. Communications adapter 434 interconnects bus 412 with an outside network enabling the data processing system to communication with other such systems. Input/Output devices are also connected to system bus 412 via user interface adapter 422 and display adapter 436. Keyboard 424, track ball 432, mouse 426 and speaker 428 are all interconnected to bus 412 via user interface adapter 422. Display monitor 438 is connected to system bus 412 by display adapter 436. In this manner, a user is capable of inputting to the system throughout the keyboard 424, trackball 432 or mouse 426 and receiving output from the system via speaker 428 and display 438.

Preferred implementations of the invention include implementations as a computer system programmed to execute the method or methods described herein, and as a computer program product. According to the computer system implementation, sets of instructions for executing the method or methods are resident in the random access memory 414 of one or more computer systems configured generally as described above. Until required by the computer system, the set of instructions may be stored as a computer program product in another computer memory, for example, in disk drive 420 (which may include a removable memory such as an optical disk or floppy disk for eventual use in the disk drive 420). Further, the computer program product can also be stored at another computer and transmitted when desired to the user's work station by a network or by an external network such as the Internet. One skilled in the art would appreciate that the physical storage of the sets of instructions physically changes the medium upon which it is stored so that the medium carries computer readable information. The change may be electrical, magnetic, chemical or some other physical change. While it is convenient to describe the invention in terms of instructions, symbols, characters, or the like, the reader should remember that all of these and similar terms should be associated with the appropriate physical elements.

Note that the invention may describe terms such as comparing, validating, selecting, identifying, or other terms that could be associated with a human operator. However, for at least a number of the operations described herein which form part of at least one of the embodiments, no action by a human operator is desirable. The operations described are, in large part, machine operations processing electrical signals to generate other electrical signals.

Although the present invention and its advantages have been described in detail, it should be understood that various changes, substitutions and alterations can be made herein without departing from the spirit and scope of the invention as defined by the appended claims.

What is claimed is:

1. A method of integrated circuit (IC) interconnect design comprising the steps of:

generating a resistor/capacitor (RC) network for a current net;

assigning a parasitic coupling capacitance and a shunt capacitance to a reference electrode for each network capacitor in said RC network, wherein said capacitances are derived from a three dimensional (3-D) field solution for a preselected wire geometry; and performing a first circuit simulation of said current net including said RC network, wherein said first circuit simulation outputs net noise signals generated in response to a noise source.

2. The method of claim 1 further comprising the steps of, if at least one of said net noise signals exceeds a preselected noise margin for said current net:

selecting a new wire geometry; and repeating said steps of assigning said parasitic and shunt capacitances, and performing a first circuit simulation.

3. The method of claim 2 further comprising the step of, for a next net, repeating said steps of generating, assigning, performing and, if at least one of said net noise signals exceeds a preselected noise margin for said current net, selecting a new wire geometry and repeating said assigning and performing steps.

4. The method of claim 2 further comprising the steps of, if said repeating step exceeds a preselected number of iterations:

selecting a default wire geometry; and outputting a report, said report flagging said current net as having unsatisfied noise margin.

5. The method of claim 1 further comprising the step of performing a second circuit simulation of said current net including said RC network, wherein said second circuit simulation outputs a slew rate for a receiver in said current net in response to a driver voltage.

6. The method of claim 5 further comprising the steps of, if at least one of said slew rates signals exceeds a preselected net slew rate for said current net:

selecting a new wire geometry; and repeating said steps of assigning said parasitic and shunt capacitances, and performing a second circuit simulation.

7. The method of claim 6 further comprising the step of, for a next net, repeating said steps of generating, assigning, performing and if at least one of said slew rates signals exceeds a preselected net slew rate for said current net, selecting a new wire geometry and repeating said assigning and performing steps.

8. The method of claim 6 further comprising the steps of, if said repeating step exceeds a preselected number of iterations:

selecting a default wire geometry; and outputting a report, said report flagging said current net as having an unsatisfied slew rate criterion.

9. The method of claim 5 wherein said second circuit simulation comprises a Rapid Interconnect Circuit Evaluator (RICE) simulation.

10. The method of claim 1 wherein said first circuit simulation comprises a Rapid Interconnect Circuit Evaluator (RICE) simulation.

11. A computer program product on a computer readable medium executable by machine for integrated circuit (IC) interconnect design comprising:

programming for generating a resistor/capacitor (RC) network for a current net;

programming for assigning a parasitic coupling capacitance and a shunt capacitance to a reference electrode for each network capacitor in said RC network, wherein said capacitances are derived from a three dimensional (3-D) field solution for a preselected wire geometry; and programming for performing a first circuit simulation of said current net including said RC network, wherein said first fast circuit simulation outputs net noise signals generated in response to a noise source.

12. The computer program product of claim 11 further comprising programming for, if at least one of said net noise signals exceeds a preselected noise margin for said current net:

selecting a new wire geometry; and repeating said assigning said parasitic and shunt capacitances, and performing a first circuit simulation.

13. The computer program product of claim 12 further comprising programming for, for a next net, repeating said generating, assigning, performing and, if at least one of said net noise signals exceeds a preselected noise margin for said current net, selecting a new wire geometry and repeating said assigning and performing.

14. The computer program product of claim 12 further comprising programming for, if said repeating exceeds a preselected number of iterations:

selecting a default wire geometry; and outputting a report, said report flagging said current net as having unsatisfied noise margin.

15. The computer program product of claim 11 further comprising programming for performing a second circuit simulation of said current net including said RC, wherein said second circuit simulation outputs a slew rate for a receiver in said current net in response to a driver voltage.

16. The computer program product of claim 15 further comprising programming for, if at least one of said slew rates signals exceeds a preselected net slew rate for said current net:

selecting a new wire geometry; and repeating said assigning said parasitic and shunt capacitances, and performing a second circuit simulation.

17. The computer program product of claim 16 further comprising programming for, for a next net, repeating said generating, assigning, performing and if at least one of said slew rates signals exceeds a preselected net slew rate for said current net, selecting a new wire geometry and repeating said assigning and performing.

18. The computer program product of claim 16 further comprising programming for, if said repeating exceeds a preselected number of iterations:

selecting a default wire geometry; and outputting a report, said report flagging said current net as having an unsatisfied slew rate criterion.

19. The computer program product of claim 15 wherein said second circuit simulation comprises a Rapid Interconnect Circuit Evaluator (RICE) simulation.

20. The computer program product of claim 11 wherein said first circuit simulation comprises a Rapid Interconnect Circuit Evaluator (RICE) simulation.

21. A data processing system for integrated circuit (IC) interconnect design comprising:

circuitry operable for generating a resistor/capacitor (RC) network for a current net;

circuitry operable for assigning a parasitic coupling capacitance and a shunt capacitance to a reference electrode for each network capacitor in said RC network, wherein said capacitances are derived from a three dimensional (3-D) field solution for a preselected wire geometry; and circuitry operable for performing a first circuit simulation of said current net including said RC network, wherein said first fast circuit simulation outputs net noise signals generated in response to a noise source.

22. The data processing system of claim 21 further comprising circuitry operable for, if at least one of said net noise signals exceeds a preselected noise margin for said current net:

selecting a new wire geometry; and repeating said assigning said parasitic and shunt capacitances, and performing a first circuit simulation.

23. The data processing system of claim 22 further comprising circuitry operable for, for a next net, repeating said generating, assigning, performing and, if at least one of said net noise signals exceeds a preselected noise margin for said current net, selecting a new wire geometry and repeating said assigning and performing.

24. The data processing system of claim 22 further comprising circuitry operable for, if said repeating exceeds a preselected number of iterations:

selecting a default wire geometry; and outputting a report, said report flagging said current net as having unsatisfied noise margin.

25. The data processing system of claim 21 further comprising circuitry operable for performing a second circuit simulation of said current net including said RC network, wherein said second circuit simulation outputs a slew rate for a receiver in said current net in response to a driver voltage.

26. The data processing system of claim 25 further comprising circuitry operable for, if at least one of said slew rates signals exceeds a preselected net slew rate for said current net:

selecting a new wire geometry; and repeating said assigning said parasitic and shunt capacitances, and performing a second circuit simulation.

27. The data processing system of claim 26 further comprising circuitry operable for, for a next net, repeating said generating, assigning, performing and if at least one of said slew rates signals exceeds a preselected net slew rate for said current net, selecting a new wire geometry and repeating said assigning and performing.

28. The data processing system of claim 26 further comprising circuitry operable for, if said repeating exceeds a preselected number of iterations:

selecting a default wire geometry; and outputting a report, said report flagging said current net as having an unsatisfied slew rate criterion.

29. The data processing system of claim 25 wherein said second circuit simulation comprises a Rapid Interconnect Circuit Evaluator (RICE) simulation.

30. The data processing system of claim 21 wherein said first circuit simulation comprises a Rapid Interconnect Circuit Evaluator (RICE) simulation.

* * * * *